United States Patent
Lai et al.

(10) Patent No.: US 11,928,882 B2
(45) Date of Patent: Mar. 12, 2024

(54) DISPLAY DEVICE, NON-CONTACT KEY, AND INPUT DEVICE

(71) Applicant: Darwin Precisions Corporation, Hsinchu County (TW)

(72) Inventors: Yu Jen Lai, Hsinchu County (TW); Ya Han Ko, Hsinchu County (TW); Yu-Ming Huang, Hsinchu County (TW); Chia Tsun Huang, Hsinchu County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 0 days.

(21) Appl. No.: 17/719,700

(22) Filed: Apr. 13, 2022

(65) Prior Publication Data

US 2022/0335745 A1 Oct. 20, 2022

(30) Foreign Application Priority Data

Apr. 20, 2021 (TW) .................................. 110114222

(51) Int. Cl.
*G06F 3/01* (2006.01)
*G06F 3/043* (2006.01)
(Continued)

(52) U.S. Cl.
CPC .......... *G06V 40/1312* (2022.01); *G06F 3/016* (2013.01); *G06F 3/0436* (2013.01);
(Continued)

(58) Field of Classification Search
CPC ............. G06V 40/1312; G06V 10/143; G06V 10/147; G06V 40/1318; G06V 40/1324;
(Continued)

(56) References Cited

U.S. PATENT DOCUMENTS 8,239,145 B2   8/2012   Suzuki
8,746,909 B2   6/2014   Chen
(Continued)

FOREIGN PATENT DOCUMENTS

CN   111517189 A   8/2020
CN   111517190 A   8/2020
(Continued)

OTHER PUBLICATIONS

Sodhi et al. "AIREAL interactive tactile experiences in free air", ACM Transactions on Graphics vol. 32 Issue , Jul. 4, 2013, Article No. 134pp. 1-10, https://doi.org/10.1145/2461912.2462007.
(Continued)

*Primary Examiner* — Amit Chatly
(74) *Attorney, Agent, or Firm* — WPAT, P.C.

(57) ABSTRACT

The present invention provides a display device, which includes a frame having an accommodating cavity and a display module disposed in the accommodating cavity. The display module includes a first light source, an optical unit, an imaging unit arranged on a side of the optical unit facing away from the first light source, and a lens array arranged on a side of the imaging unit facing away from the first light source. Corresponding to a preset pattern, light emitted by the first light source passes through the optical unit, the imaging unit and the lens array to form a default floating image in a floating display area outside the accommodating cavity. In addition, the present invention also provides a non-contact key and an input device including the above display module.

19 Claims, 16 Drawing Sheets

(51) Int. Cl.
*G06F 3/044* (2006.01)
*G06V 10/143* (2022.01)
*G06V 10/147* (2022.01)
*G06V 40/13* (2022.01)

(52) U.S. Cl.
CPC ............ *G06F 3/044* (2013.01); *G06V 10/143* (2022.01); *G06V 10/147* (2022.01); *G06V 40/1318* (2022.01); *G06V 40/1324* (2022.01); *G06F 2203/04106* (2013.01); *G06F 2203/04107* (2013.01)

(58) Field of Classification Search
CPC ........ G06F 3/016; G06F 3/0436; G06F 3/044; G06F 2203/04106; G06F 2203/04107; G06F 3/0202; G06F 3/0213; G06F 3/0238; G06F 3/043; G06F 3/042; H03K 17/941; G09F 19/12; G09F 19/18
See application file for complete search history.

(56) References Cited

U.S. PATENT DOCUMENTS

| | | | | |
|---|---|---|---|---|
| 2010/0085692 | A1* | 4/2010 | Kim | G06F 1/1643 361/679.01 |
| 2014/0347322 | A1 | 11/2014 | Kamata | |
| 2014/0361990 | A1* | 12/2014 | Leister | G02B 30/31 345/156 |
| 2019/0204991 | A1* | 7/2019 | He | G06F 3/0436 |
| 2019/0243527 | A1* | 8/2019 | Kuribayashi | G06F 3/04817 |
| 2019/0369740 | A1* | 12/2019 | Tokuchi | G06F 3/011 |
| 2021/0203916 | A1 | 7/2021 | Ko | |
| 2022/0005879 | A1* | 1/2022 | Li | H10K 59/126 |
| 2022/0232200 | A1* | 7/2022 | Yang | G06T 19/20 |

FOREIGN PATENT DOCUMENTS

| | | |
|---|---|---|
| CN | 112265878 A | 1/2021 |
| JP | H1131444 A | 2/1999 |
| JP | 2007279820 A | 10/2007 |
| TW | 201342880 A | 10/2013 |
| TW | I444721 | 7/2014 |
| TW | M527649 U | 8/2016 |
| TW | 201743111 A | 12/2017 |
| TW | M570467 | 11/2018 |
| TW | I700516 B | 8/2020 |
| TW | I715395 B | 1/2021 |

OTHER PUBLICATIONS

Hoshi et al. "Noncontact Tactile Display Based on Radiation Pressure of Airborne Ultrasound", Article in IEEE Transactions on Haptics • Jul. 2010, IEEE.

Long et al. "Rendering Volumetric Haptic Shapes in Mid-Air using Ultrasound", Proceedings of ACM SIGGRAPH Asia 2014. ACM Transactions on Graphics, 33(6), [181]. https://doi.org/10.1145/2661229.2661257, University of Bristol.

CNIPA has issued the Office Action for the corresponding China application dated Apr. 25, 2023.

* cited by examiner

DISPLAY DEVICE, NON-CONTACT KEY, AND INPUT DEVICE

TECHNICAL FIELD

The present invention relates to a display device, a non-contact key, and an input device. Specifically, the present invention relates to a display device, a non-contact key, and an input device for forming a default floating image.

BACKGROUND

During operation, direct contact with an apparatus body of a physical mechanical key or a surface touch apparatus is required. Therefore, wear is inevitably caused after long-term use, reducing a service life of the physical mechanical key or the surface touch apparatus. In addition, in a case that the physical mechanical key or the surface touch apparatus is disposed in a public occasion, numerous people contact the apparatus body. As a result, sanitation management is more difficult. Based on the above, the physical mechanical key or surface touch apparatus also increases a risk that infectious pathogens such as viruses and bacteria adhere to the apparatus body and indirectly infect the contacts.

Based on the above, in order to reduce or avoid defects and/or risks that may be caused by the above contact, a non-contact input device such as a voice-controlled input device may be applied to various situations. However, since it is difficult to identify sound content, it is difficult to accurately input an instruction to the voice-controlled input device. Moreover, in case of multi-user operation or background noise, mutual interference may be caused. In addition, users with phonatory disorders or language barriers may fail to use and operate the voice-controlled input device. Therefore, a non-contact input device that is applicable to various situations and can replace the above physical mechanical key or the surface touch apparatus is required to be researched and developed. In particular, a technology that can form a default floating image for identification or even further corresponding operations is required to be developed to resolve the above problem.

SUMMARY

Technical Solutions

In order to resolve the above problem, an embodiment of the present invention provides a non-contact key, which includes a frame, a touch module, and a display module disposed in an accommodating cavity of the frame. The display module includes a first light source, an optical unit, an imaging unit arranged on a side of the optical unit facing away from the first light source and having a preset pattern, and a lens array arranged on a side of the imaging unit facing away from the first light source. Based on the above, corresponding to a preset pattern, light emitted by the first light source passes through the optical unit, the imaging unit, and the lens array to form a default floating image in a floating display area outside the accommodating cavity. In addition, the touch module is configured to establish a floating touch area outside the accommodating cavity, where the floating display area at least partially overlaps the floating touch area.

Another embodiment of the present invention provides an input device, which has a key array including a plurality of non-contact keys in adjacent arrangement.

Still another embodiment of the present invention provides a display device, which includes a frame and a display module disposed in an accommodating cavity of the frame. The display module includes a first light source, an optical unit, an imaging unit arranged on a side of the optical unit facing away from the first light source and having a preset pattern, and a lens array arranged on a side of the imaging unit facing away from the first light source. Based on the above, corresponding to a preset pattern, light emitted by the first light source passes through the optical unit, the imaging unit, and the lens array to form a default floating image in a floating display area outside the accommodating cavity.

Effects Compared to the Prior Art

According to the display device, the non-contact key, and the input device provided in the embodiments of the present invention, the default floating image can be formed at a floating position for identification. Based on this, a floating display function can be realized, and corresponding functions such as floating touch and other operations corresponding to identified content may be further implemented by using operation or reaction apparatuses such as a touch generation apparatus.

DETAILED DESCRIPTION

Embodiments are described below, and a person of ordinary skill in the art should easily understand the spirit and the principle of the present invention with reference to the accompanying drawings. However, even though some specific embodiments may be described in detail in this specification, the embodiments are merely examples, and shall not be regarded as limitations or exhaustive meanings in terms of every aspect. Therefore, for a person of ordinary skill in the art, variations and amendments of the present invention may be obvious and may be achieved easily without departing from the spirit and the principle of the present invention.

Figure 1:
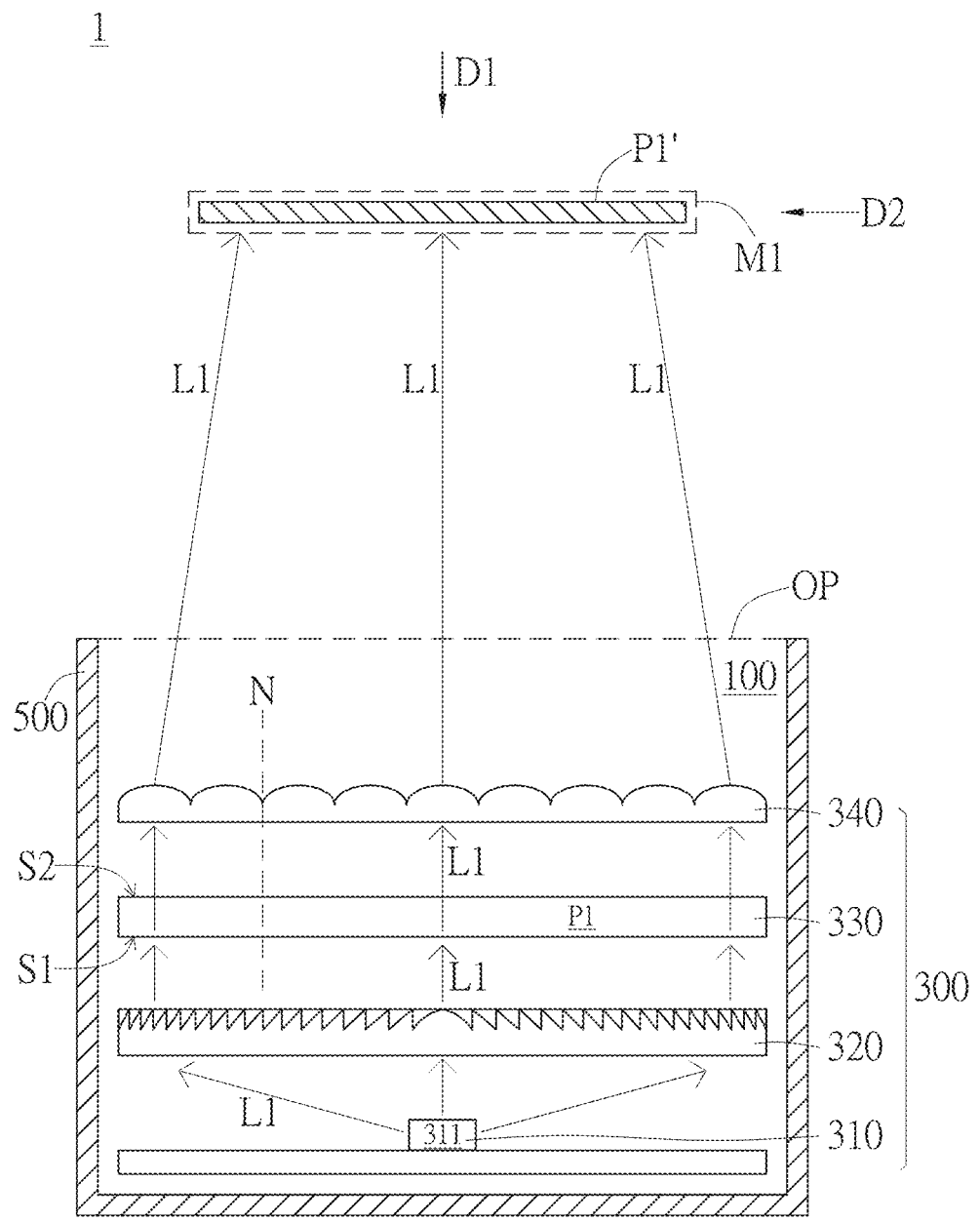
FIG. 1 is a schematic diagram of a display device having a first light source, an optical unit, an imaging unit, and a lens array according to an embodiment of the present invention.
Figure 2:
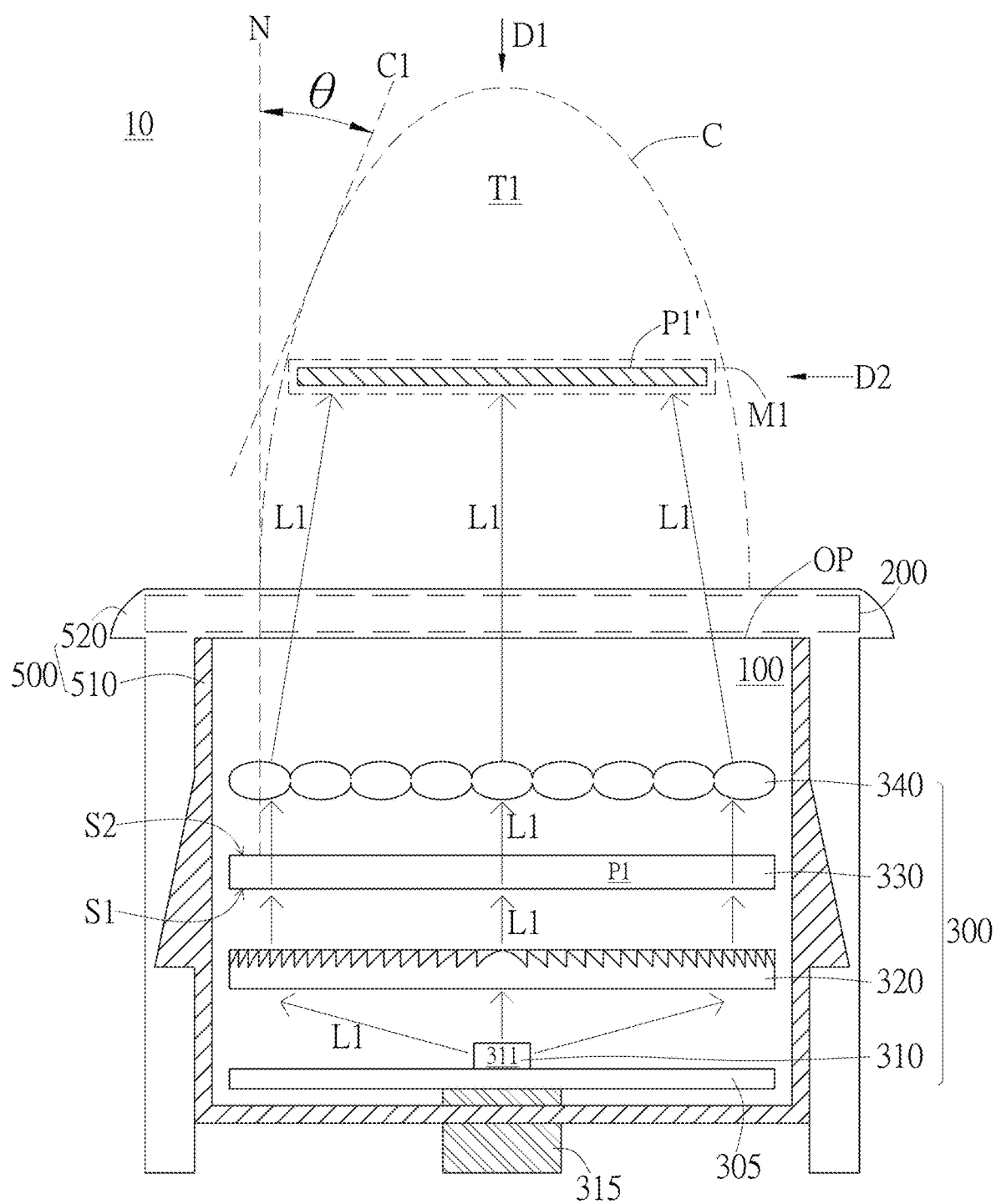
FIG. 2 is a schematic diagram of a non-contact key having a display module and a touch module according to an embodiment of the present invention.

Referring to FIG. 1, an embodiment of the present invention provides a display device 1. The display device 1 includes an accommodating cavity 100 and a display module 300 disposed in the accommodating cavity 100. Referring to FIG. 2, another embodiment of the present invention provides a non-contact key 10. The non-contact key 10 is the same as or similar to the display device 1, and also includes the accommodating cavity 100 and the display module 300 disposed in the accommodating cavity 100. Compared with the display device 1, the non-contact key 10 further includes a touch module 200.

Based on the above, the display device 1 and the non-contact key 10 both can form a default floating image P1' in a floating display area M1 outside the accommodating cavity 100. For example, the default floating image P1' may be presented in air or an environment on the display device 1 and the non-contact key 10 where no physical assemblies are disposed. In addition, in a case that the touch module 200 is further disposed on the non-contact key 10 of FIG. 2, the touch module 200 may be configured to establish a floating touch area T1 outside the accommodating cavity 100 (specific arrangement is further described in detail below with reference to other figures). The floating display area M1 at least partially overlaps the floating touch area T1. For example, according to an embodiment, the floating display area M1 and the floating touch area T1 may be disposed relative to a same central axis. In a top view direction D1, the floating display area M1 and the floating touch area T1 may at least partially overlap.

Specifically, as shown in FIG. 1 and FIG. 2, the accommodating cavity 100 may be defined based on, for example, a frame 500 having different configurations or detailed structures. The display module 300 of the display device 1 or the non-contact key 10 is disposed in the accommodating cavity 100 defined by the frame 500. The display module 300 successively includes the following from bottom to top: a first light source 311 configured to emit light L1 (or a light source 310 configured to emit light), an optical unit 320 configured to diffuse and/or collimate the light L1 emitted by the first light source 311, an imaging unit 330 disposed on a side of the optical unit 320 facing away from the first light source 311 and in optical alignment to the optical unit 320, and a lens array 340 disposed on a side of the imaging unit 330 facing away from the first light source 311 and in optical alignment to the optical unit 320.

Specifically, the first light source 311 may be various light sources, for example, but is not limited to, a light emitting diode (LED) or an electroluminescent optical unit. In addition, for example, as shown in FIG. 2 (but not limited to FIG. 2), the first light source 311 may be disposed on a circuit board 305 and is connected to a power source, a control apparatus, or other apparatuses by using a connection unit 315. However, the above is merely an example. The configuration and the external connection of the first light source 311 that can emit light are not limited thereto.

Based on the above, the light L1 is emitted based on the first light source 311. As shown in FIG. 1 and FIG. 2, the light L1 may then pass through the optical unit 320 and may be diffused and/or collimated by the optical unit 320, and then enter the imaging unit 330. Herein, for example, the expression "the light is collimated by the optical unit 320" may be defined as follows: the optical unit 320 is configured to emit the light L1 passing through the optical unit 320 to the imaging unit 330 at an angle of ±10 degrees relative to a normal line N perpendicular to the imaging unit 330. However, the present invention is not limited to the above example. The optical unit 320 may be any optical unit that can cause the light emitted by the first light source 311 (or other light sources of the light source 310) to be incident on the imaging unit 330 at an angle more vertical than an original emitting angle. Alternatively, the optical unit 320 may be any optical unit that can cause the light emitted by the first light source 311 (or other light sources of the light source 310) to be incident on the imaging unit 330 uniformly.

According to some embodiments, the optical unit 320 may be a Fresnel lens. However, the present invention is not limited thereto. In addition, according to some embodiments, a microstructure of the optical unit 320 may be adjusted and disposed according to an incident angle required for the imaging unit 330, or corresponding diffusion particles may be added.

Based on the above, the light L1 is diffused and/or collimated based on the optical unit 320, so that the light L1 can enter the imaging unit 330 in optical alignment to the optical unit 320 at a required angle. Specifically, the imaging unit 330 may have a preset pattern P1. For example, the imaging unit 330 may be a negative film, a photomask, a layer diaphragm, or the like having the preset pattern P1, but the present invention is not limited thereto. Based on the above, the light L1 may pass through the imaging unit 330 having the designed preset pattern P1 according to a designed incident angle (which is collimated based on the optical unit 320). In this way, when the light L1 passes through the imaging unit 330 and further enters the lens array 340 in optical alignment to the optical unit 320, the lens array 340 can focus and project the light L1 passing through the imaging unit 330. Then, corresponding to the preset pattern P1 of the imaging unit 330, the default floating image P1' may be formed in the floating display area M1 outside the accommodating cavity 100.

According to some embodiments, as shown in FIG. 1, the lens array 340 may be a single-sided convex lens array. A convex surface thereof may face away from the imaging unit 330 or face the imaging unit 330. In addition, according to other embodiments, as shown in FIG. 2, the lens array 340 may alternatively be a double-sided convex lens array. However, the above are merely examples, and the present invention is not limited thereto. In addition, according to other embodiments, since the lens array is required to be in optical alignment to the optical unit 320 and the imaging unit 330, if the lens array 340 is the double-sided convex lens array, precisions of alignment of two sides of the lens array 340 are required to be less than 0.1 mm.

Figure 3:
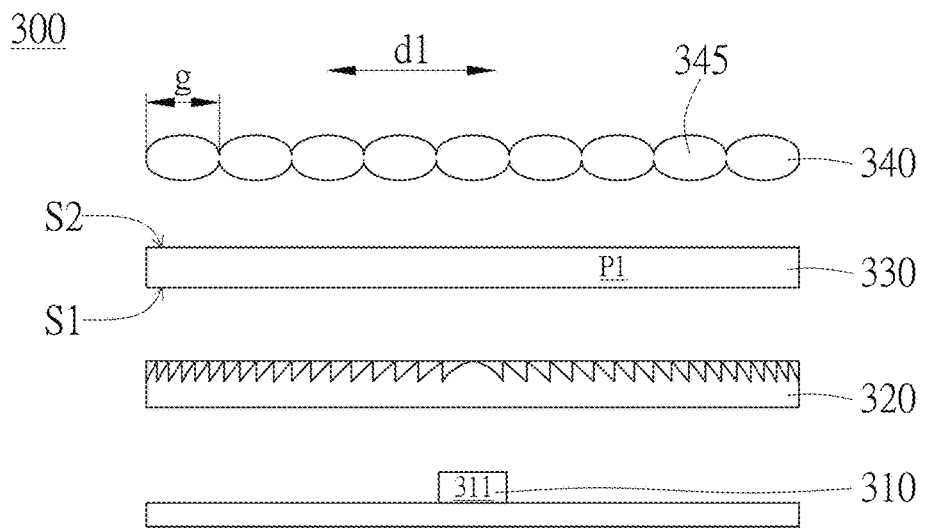
FIG. 3 is a schematic size diagram of a lens unit of a lens array according to an embodiment of the present invention.

Further, FIG. 3 is an enlarged schematic diagram of the lens array 340 according to an embodiment. The lens array 340 may include a plurality of lens units 345 arranged in an arrangement direction d1 substantially parallel to a surface S2 of the imaging unit 330 facing the lens array 340. A size g of each of the lens units 345 in the arrangement direction d1 may be in a range of 0.2-1 mm.

According to some embodiments, the lens array 340 may be manufactured based on processes such as ultraviolet (UV) printing, injection molding, or thermal flat pressing.

As described above, as shown in FIG. 1 and FIG. 2, the optical unit 320, the imaging unit 330, and the lens array 340 may be designed in optical alignment to each other. In this way, the light L1 emitted by the first light source 311 can pass through the optical unit 320, the imaging unit 330, and the lens array 340 to form the default floating image P1' corresponding to the preset pattern P1 in the floating display area M1 outside the accommodating cavity 100. Therefore, according to this embodiment, the default floating image P1' can be implemented based on a relatively simplified architecture. Thus, the default floating image P1' is more widely applicable to various situations requiring floating display. In addition, according to this embodiment, due to the relatively simplified architecture, the default floating image P1' may be displayed at arrangement positions in a small or limited space.

As shown in FIG. 1 and FIG. 2, according to some embodiments, a cross-sectional area of the default floating image P1', the floating touch area T1, or a combination of the default floating image P1' and the floating touch area T1 substantially parallel to a surface S2 of the imaging unit 330 facing the lens array 340 gradually decreases in a direction facing away from the display module 300. For example, as shown in FIG. 2, an included angle θ between a tangent line C1 of an outline of the default floating image P1', the floating touch area T1, or a combination of the default floating image P1' and the floating touch area T1 and a normal line N substantially perpendicular to the surface S2 of the imaging unit 330 facing the lens array 340 is in a range of 85-45 degrees. Alternatively, according to some embodiments, in a top view from a side of the lens array 340 facing away from the imaging unit 330 (that is, observed in the top view direction D1), an area of the imaging unit 330 may be equal or greater than an area of the default floating image M1 or the floating touch area T1. In this way, if such display devices 1 or non-contact keys 10 are arranged adjacent to each other, the displayed default floating images P1' or the established floating touch areas T1 may be located right above the display devices 1 or the non-contact keys 10 respectively. In this way, difficulty in identification or mutual interference or mixing of the displayed default floating images P1' or the established floating touch areas T1 of the different display devices 1 or non-contact keys 10 can be reduced or prevented. Therefore, each display device 1 or each non-contact key 10 can perform displaying or touch sensing independently and clearly.

In addition, as shown in FIG. 1 and FIG. 2, the accommodating cavity 100 may have an opening OP facing the floating display area M1. For example, the frame 500 may have a wall body 510 defining the accommodating cavity 100. The wall body 510 may define the opening OP facing the predetermined floating display area M1. Based on the above, for aesthetics, protection, or other functions, according to some embodiments, the frame 500 may further include a transparent cover plate 520 for the light L1 to pass through. The transparent cover plate 520 covers the opening OP of the accommodating cavity 100 facing the floating display area M1. However, the above is merely an example, and the present invention may not be limited thereto.

Figure 4A:
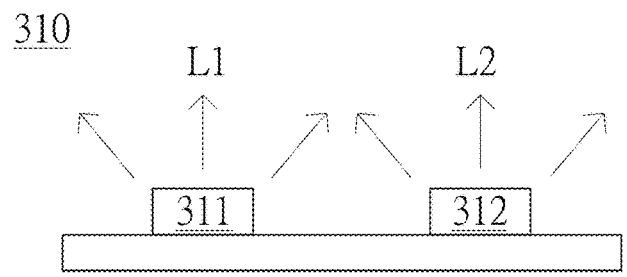
FIG. 4A and FIG. 4B are schematic diagrams of modes for implementing light having different colors according to embodiments of the present invention.
Figure 4B:
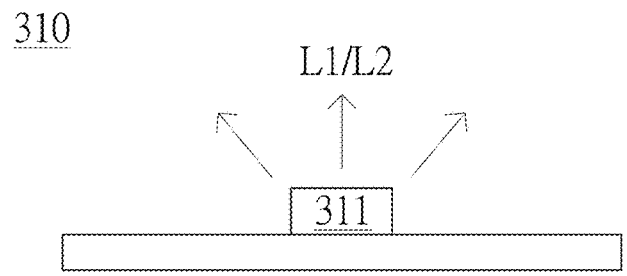

Further referring to FIG. 4A together with FIG. 1 and FIG. 2, according to some embodiments, the light source 310 may further include a second light source 312 in addition to the first light source 311. Specifically, the display module 300 may further include the second light source 312 configured to emit light L2 having a color different from that of the light emitted by the first light source 311. Similar to the first light source 311, the second light source 312 may be substantially disposed on a side of the optical unit 320 facing away from the imaging unit 330 (for example, the second light source 312 and the first light source 311 are integrated on a same circuit board). In addition, further referring to FIG. 4B together with FIG. 1 and FIG. 2, the first light source 311 may alternatively be a light source capable of adjusting the color of the emitted light (for example, the light L1 having a first color and the light L2 having a second color). For example, the first light source 311 may be a light source capable of adjusting a red, green, and blue (RGB) ratio. Based on the above, according to FIG. 4A and FIG. 4B, when the design of the imaging unit 330 having the preset pattern P1 is constant, the color of the default floating image required to be projected and displayed by the imaging unit 330 is adjusted according to requirements. For example, the same default floating image may be presented in a different color in the day or at night. Alternatively, the color of the default floating image may be switched corresponding to the operations during the operation.

Figure 5:
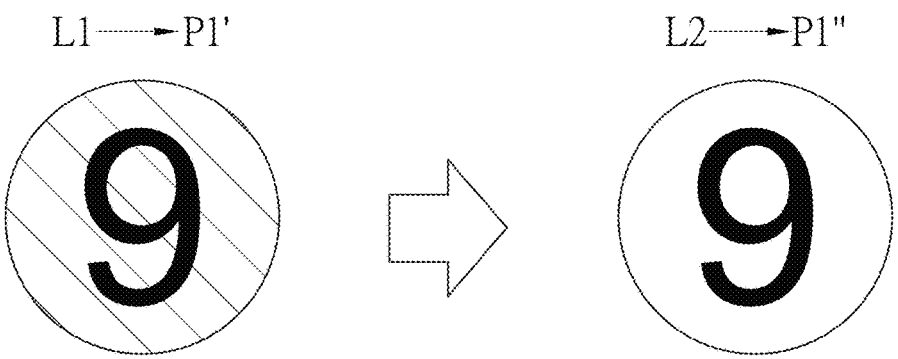
FIG. 5 is a schematic diagram of different floating images formed based on a preset pattern of a same imaging unit according to different emitted light according to an embodiment of the present invention.

For example, in an implementation shown in FIG. 4A, further referring to FIG. 5, during displaying of the default floating image P1' based on the light L1 emitted by the first light source 311, if a touch operation is confirmed (for example, the floating touch area T1 is touched), the display module 300 may turn off the first light source 311 and cause the second light source 312 to emit the light L2. In this way, a feedback floating image P1" corresponding to the preset pattern P1 and having a color different from that of the default floating image P1' is formed outside the accommodating cavity 100. Alternatively, in an implementation shown in FIG. 4B, further referring to FIG. 5, during displaying of the default floating image P1' based on the light L1 emitted by the first light source 311, if a touch operation is confirmed (for example, the floating touch area T1 is touched), the display module 300 may switch the color of the light (the light L2) emitted by the first light source 311. In this way, a feedback floating image P1" corresponding to the preset pattern P1 and having a color different from that of the default floating image P1' is formed outside the accommodating cavity 100. Therefore, a user may determine that the operation has been performed based on the conversion of the default floating image P1' to the feedback floating image P1" having a different color. In this way, the feedback performance and the reliability of the operation are improved.

Based on the above, according to different embodiments of the present invention, a quantity, a situation, and an implementation for which switching may be performed between the emitted light L1 and the emitted light L2 are not limited to the examples specifically described above. For example, according to some embodiments, a plurality of first light source 311 and second light sources 312 may be disposed. Alternatively, light sources having colors other than the colors of the first light source 311 and the second light source 312 may be disposed. Alternatively, further, the first light source 311 and the second light source 312 are caused to emit the light simultaneously, so as to realize more changes. Based on the above, the changes shall all fall within the scope of the present invention.

Figure 6A:
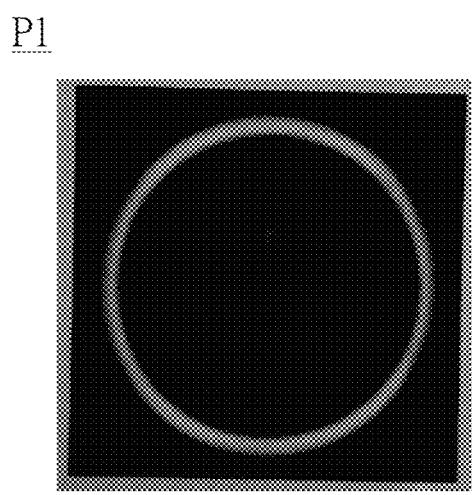
FIG. 6A is a picture of a preset pattern of an actual imaging unit according to an embodiment of the present invention.
Figure 6B:
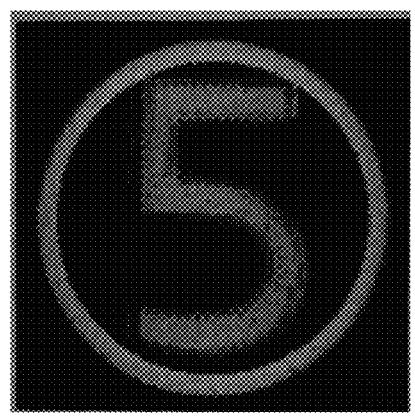
FIG. 6B is a front view of a picture of a default floating image projected after actual light passes through a preset pattern of FIG. 6A according to an embodiment of the present invention.
Figure 6C:
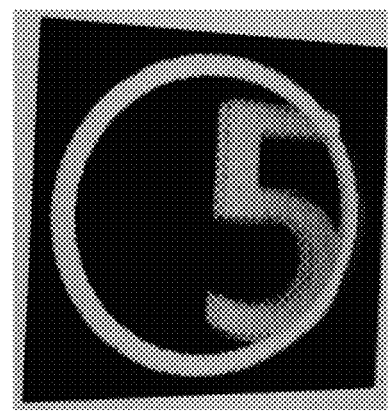
FIG. 6C is an oblique side view of the picture of the default floating image projected after the actual light passes through the preset pattern of FIG. 6A according to an embodiment of the present invention.

As described above, by using the display device 1 shown in FIG. 1 or the non-contact key 10 shown in FIG. 2, the default floating image P1' corresponding to the default image P1 of the imaging unit 330 can be formed in the floating display area M1 outside the accommodating cavity 100. For example, according to an embodiment, FIG. 6A shows an actual picture of the preset pattern P1 of the imaging unit 330, FIG. 6B shows an actual picture of the default floating image P1' projected after the light passes through the preset pattern P1 (in the top view direction D1 in FIG. 1 and FIG. 2), and FIG. 6C shows an actual picture of the default floating image P1' projected after the light passes through the preset pattern P1 (in the oblique side view direction D2 in FIG. 1 and FIG. 2). Based on the above, the preset pattern P1 is designed according to a default floating image P1' that is finally designed and an optical effect of the optical unit 320, the imaging unit 330, and the lens array 340 that are in optical alignment. Therefore, according to some embodiments, under direct observation, the preset pattern P1 may be different from an observed surface appearance of the final default floating image P1' projected after the light passes through the preset pattern P1. For example, the preset pattern P1 may be a static two-dimensional image, and the default floating image P1' that is finally presented may be a static three-dimensional image or the like. Based on the above and this embodiment, since the preset pattern P1 is a constant static two-dimensional image, and the light is converted to be projected onto a different site in a space by the optical unit 320, the imaging unit 330, and the lens array 340 that are in optical alignment, a relatively stable naked-eye three-dimensional effect that has high resolution and can present a three-dimensional image from a plurality of observation angles can be established.

Figure 6D:
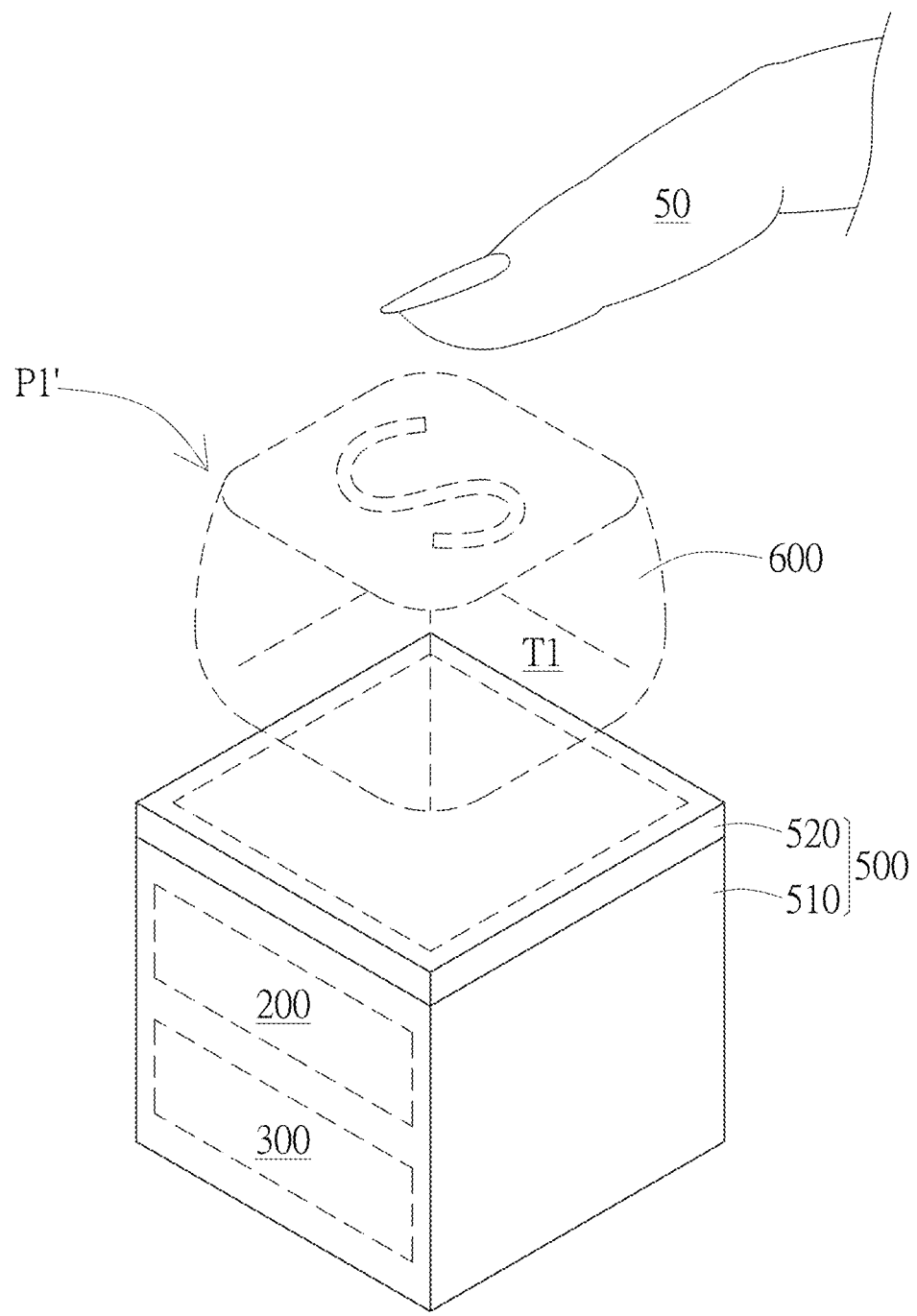
FIG. 6D is a schematic diagram of a default floating image presented as a floating three-dimensional key according to an embodiment of the present invention.

According to some embodiments, the default floating image P1' may be, for example, a naked-eye three-dimensional image. For example, as shown in FIG. 6D, the naked-eye three-dimensional image may be an image presenting a floating three-dimensional key 600, and can present a three-dimensional effect from at least two different observation angles. Based on the above, in this case, if the touch module 200 is disposed and the floating touch area T1 overlapping the default floating image P1' is established, a touch and sensing object 50 (for example, a hand or a stylus) may further perform operations by touching or pressing the floating three-dimensional key 600.

An exemplary specific implementation capable of implementing the touch module 200 of the non-contact key 10 shown in FIG. 2 is further described below.

Figure 7:
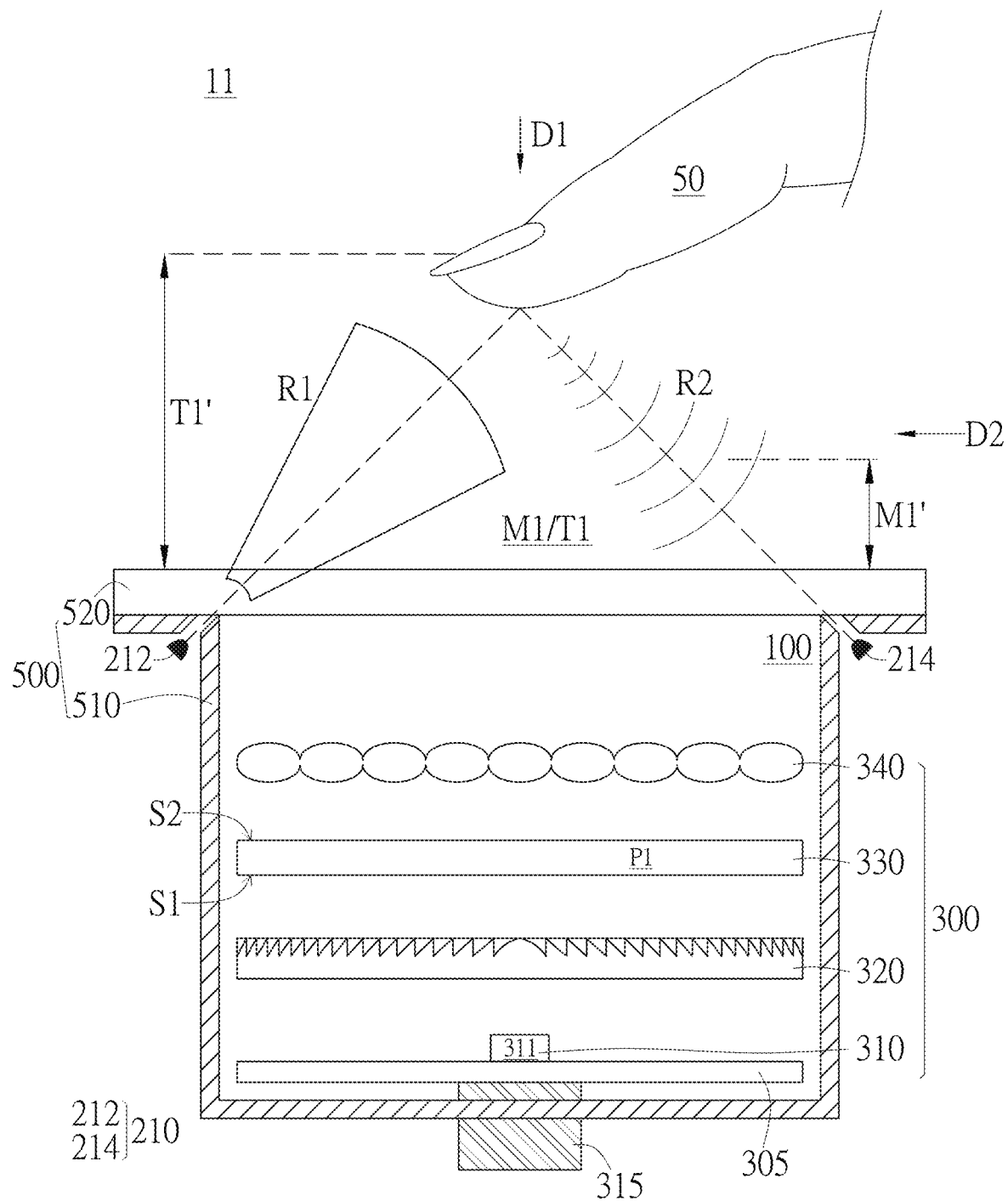
FIG. 7 is a schematic diagram of a non-contact key having a touch module being an infrared touch module according to an embodiment of the present invention.

Based on the above, according to an embodiment of the present invention, similar to the non-contact key 10 shown in FIG. 2, FIG. 7 shows a non-contact key 11 having a touch module 200 being an infrared touch module 210. Specifically, the infrared touch module 210 may include an infrared generator 212 and an infrared receiver 214. The infrared generator 212 and the infrared receiver 214 may be respectively arranged between the floating display area M1 and the display module 300 corresponding to two sides of the floating display area M1 and respectively arranged obliquely to emit an infrared ray R1 toward the preset floating touch area T1 or receive an infrared ray R2. For example, the infrared touch module 210 may be disposed at a position 2-30 mm above the display module 300. In addition, an included angle is formed between the infrared generator 212 and the infrared receiver 214, so that an established infrared sensing range can cover the floating touch area T1. Therefore, the floating touch area T1 that can be touched and sensed may be established based on the infrared ray.

Herein, for concise of the figures, outlines of ranges of the floating display area M1 and the floating touch area T1 are not drawn clearly, and for possible implementations of the floating display area M1 and the floating touch area T1, refer to the foregoing figures. In addition, according to some embodiments, in the implementations described above and below, the floating display area M1 may be established at a position 0-10 cm above the accommodating cavity 100. For example, as shown in FIG. 7, the floating display area M1 may be established within a height of a floating display area range M1'. In addition, according to some embodiments, the floating touch area T1 may be established at a position 0-20 cm above the accommodating cavity 100. For example, as shown in FIG. 7, the floating touch area T1 may be established within a height of a floating touch area range T1'. However, the above are merely examples, and the present invention is not limited thereto.

Figure 8:
FIG. 8 is a schematic top view of the non-contact key having the touch module being the infrared touch module according to an embodiment of the present invention.

In order to achieve unhindered emission of the infrared ray R1 and receipt of the infrared ray R2, according to some embodiments, the infrared generator 212 and the infrared receiver 214 may be disposed on the frame 500, or holes are formed on a non-transparent part of the frame 500 corresponding to the infrared generator 212 and the infrared receiver 214. In this way, the infrared ray R1 and the infrared ray R2 can be emitted more smoothly. If the frame 500 is made of a transparent material or an infrared transmissive material, no holes are required. Based on the above, observed in the top view direction D1, the configuration of the floating display area M1 and/or the floating touch area T1 where the default floating image P1' can be presented relative to the infrared generator 212 and the infrared receiver 214 may be shown, for example, in FIG. 8. However, the above arrangement positions and manners of the infrared generator 212 and the infrared receiver 214 are merely examples, and the present invention is not limited thereto. In addition, details not described in this implementation may be the same as or similar to, for example, the foregoing embodiments, or may be freely changed without causing a conflict with the core technical principle. The details are not described herein repeatedly.

Figure 9:
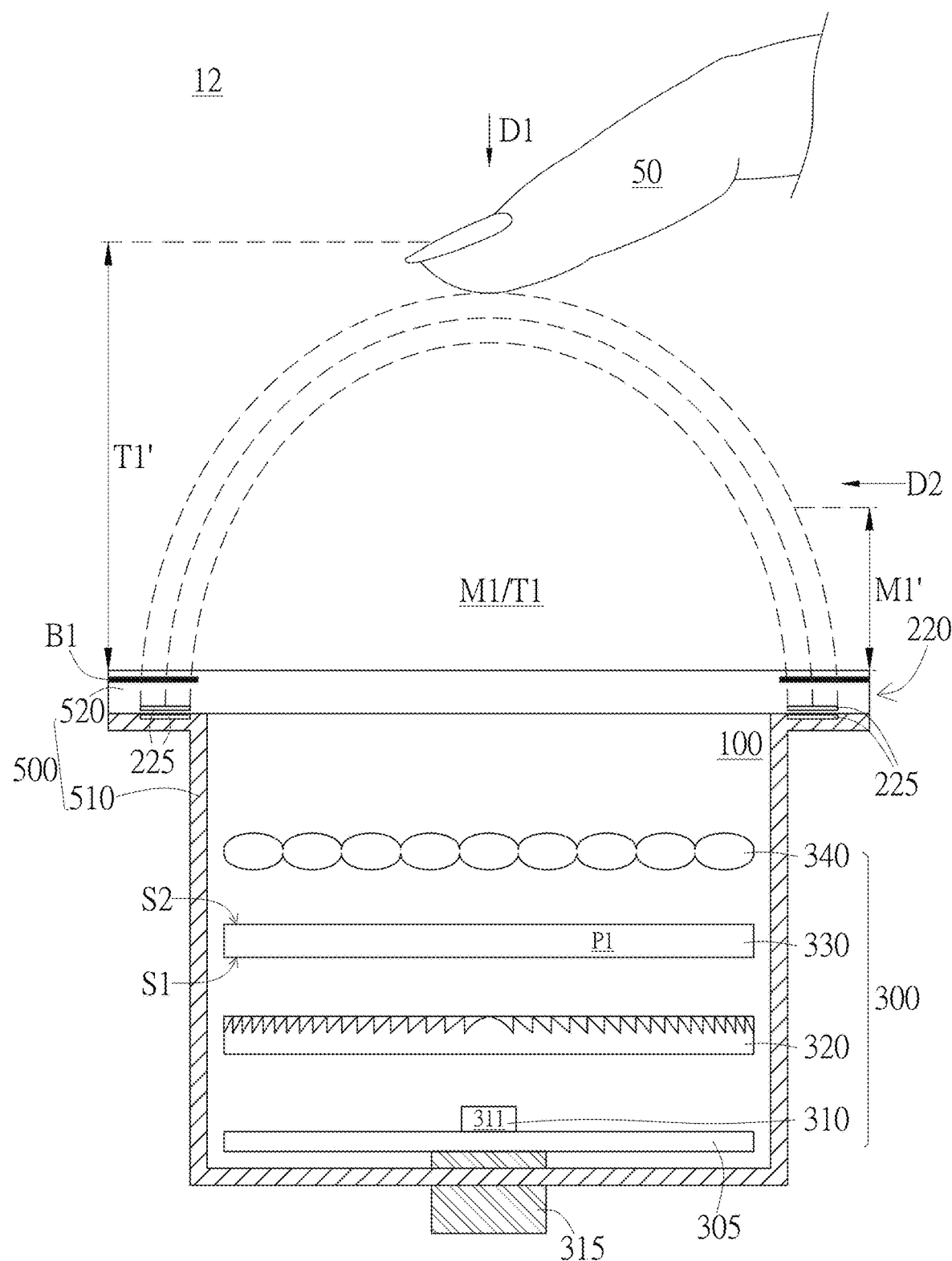
FIG. 9 is a schematic diagram of a non-contact key having a touch module being a capacitive touch module according to an embodiment of the present invention.
Figure 10:
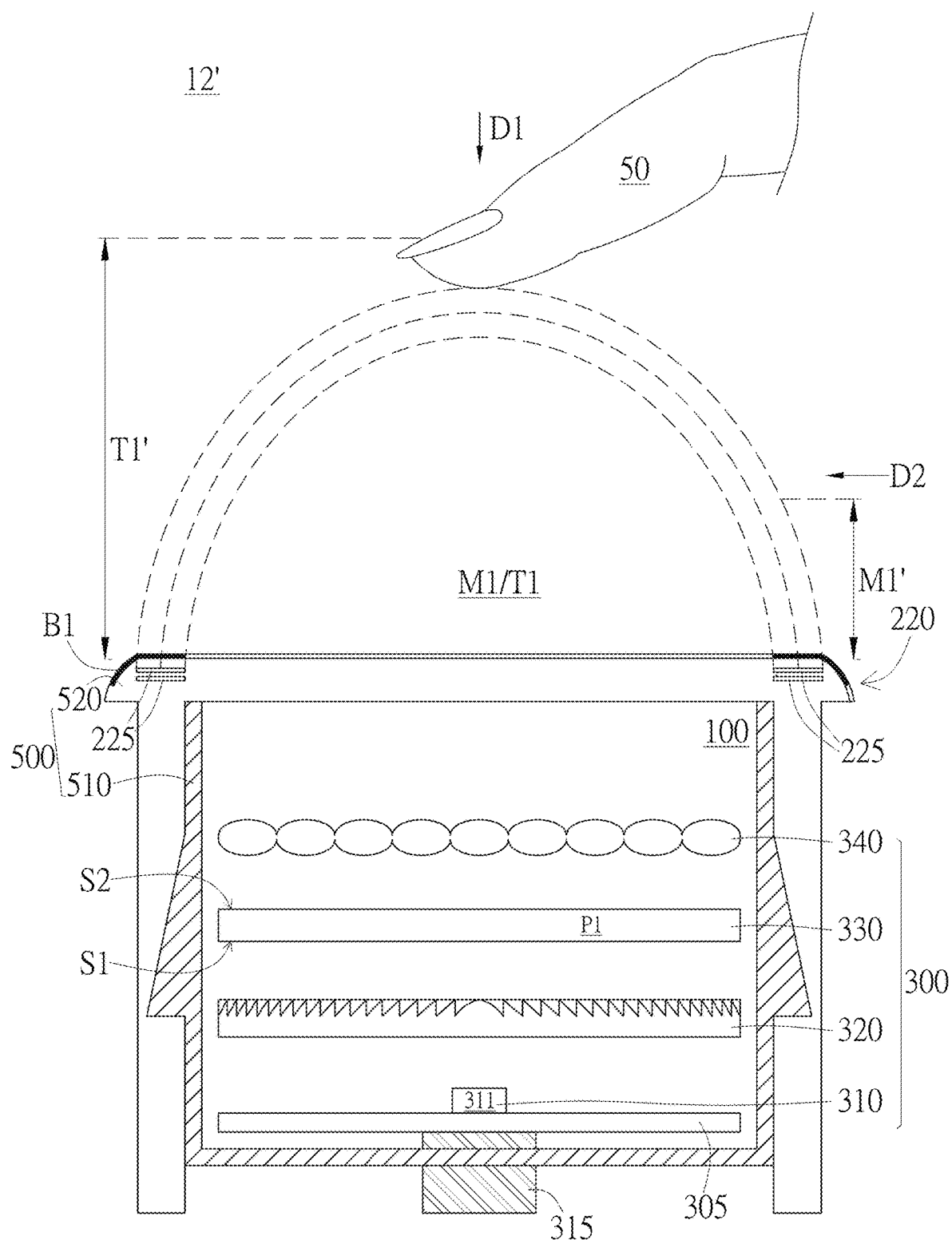
FIG. 10 is a schematic diagram of a non-contact key having a touch module being a capacitive touch module according to an embodiment of the present invention.

Next, according to still another embodiment of the present invention, similar to the non-contact key 10 shown in FIG. 2, FIG. 9 and FIG. 10 respectively show non-contact keys 12 and 12' having touch modules 200 being a capacitive touch module 220. Specifically, the capacitive touch module 220 may include capacitive touch circuits 225. The capacitive touch circuits 225 may be respectively disposed between the floating display area M1 and the display module 300 at least corresponding to two sides of the floating display area M1. Therefore, the floating touch area T1 that can be touched and sensed may be established above a center of the accommodating cavity 100 based on capacitive coupling between the capacitive touch circuits 225 disposed on different positions.

According to some embodiments, as shown in FIG. 9, the capacitive touch circuits 225 may be established on the frame 500. For example, an additional circuit board (not shown) may be disposed on the wall body 510 defining the accommodating cavity 100, and is disposed between the floating display area M1 and the display module 300 to establish, above the center of the accommodating cavity 100, the floating touch area T1 that can be touched and sensed. Further, when the frame 500 further includes the transparent cover plate 520 configured to cover the opening of the accommodating cavity 100 facing the floating display area M1, if the transparent cover plate 520 relatively covers or protects the capacitive touch circuits 225, shielding patterns B1 may be selectively formed on the transparent cover plate 520 corresponding to one sides of the capacitive touch circuits 225 facing away from the display module 300. Therefore, the capacitive touch circuits 225 can be less likely to be discovered, so that the entire non-contact key 12 is more aesthetically pleasing or integral. However, the above is merely an example. Alternatively, the transparent cover plate 520 may not be disposed, or the shielding patterns B1 corresponding to the capacitive touch circuits 225 may not be disposed. In addition, the capacitive touch circuits 225 may be made of a transparent conductive material, such as indium tin oxide (ITO), polymer conductive materials (such as PEDOT:PSS), or carbon nanotube (CNT). In addition, the capacitive touch circuits 225 may be manufactured in the floating display area M1. Therefore, the floating display area M1 overlaps the floating touch area T1.

In addition, as shown in FIG. 10, according to still other embodiments, when the frame 500 further includes the transparent cover plate 520 configured to cover the opening of the accommodating cavity 100 facing the floating display area M1, the capacitive touch circuits 225 may be formed by injection molding with the transparent cover plate 520 by means of in-mold electronics (IME) directly, and are disposed between the floating display area M1 and the display module 300 and establish, above the center of the accommodating cavity 100, the floating touch area T1 that can be touched and sensed. Similarly, in this implementation, the shielding patterns B1 may be selectively disposed on the transparent cover plate 520 corresponding to the sides of the capacitive touch circuits 225 facing away from the display module 300. For example, the shielding patterns B1 may be disposed by film printing or black frame printing by means of the IME. Therefore, the capacitive touch circuits 225 can be less likely to be discovered, so that the entire non-contact key 12' is more aesthetically pleasing or integral. However, the above is merely an example. Alternatively, the shielding patterns B1 corresponding to the capacitive touch circuits 225 may not be disposed.

According to the implementation shown in FIG. 10, the capacitive touch circuits 225 and the transparent cover plate 520 are integrally manufactured and disposed. Therefore, a quantity of assemblies or apparatuses that may be required during establishment of the floating touch area T1 can be reduced. In this way, the integrity of the entire apparatus can be further improved, and an occupied space, a thickness, and a weight of the entire apparatus can be reduced, thereby improving the aesthetic degree and/or simplicity of the appearance of the apparatus, and the apparatus is more applicable to occasions having a small arrangement space or various conventional application fields to which floating touch cannot be applied.

Figure 11:
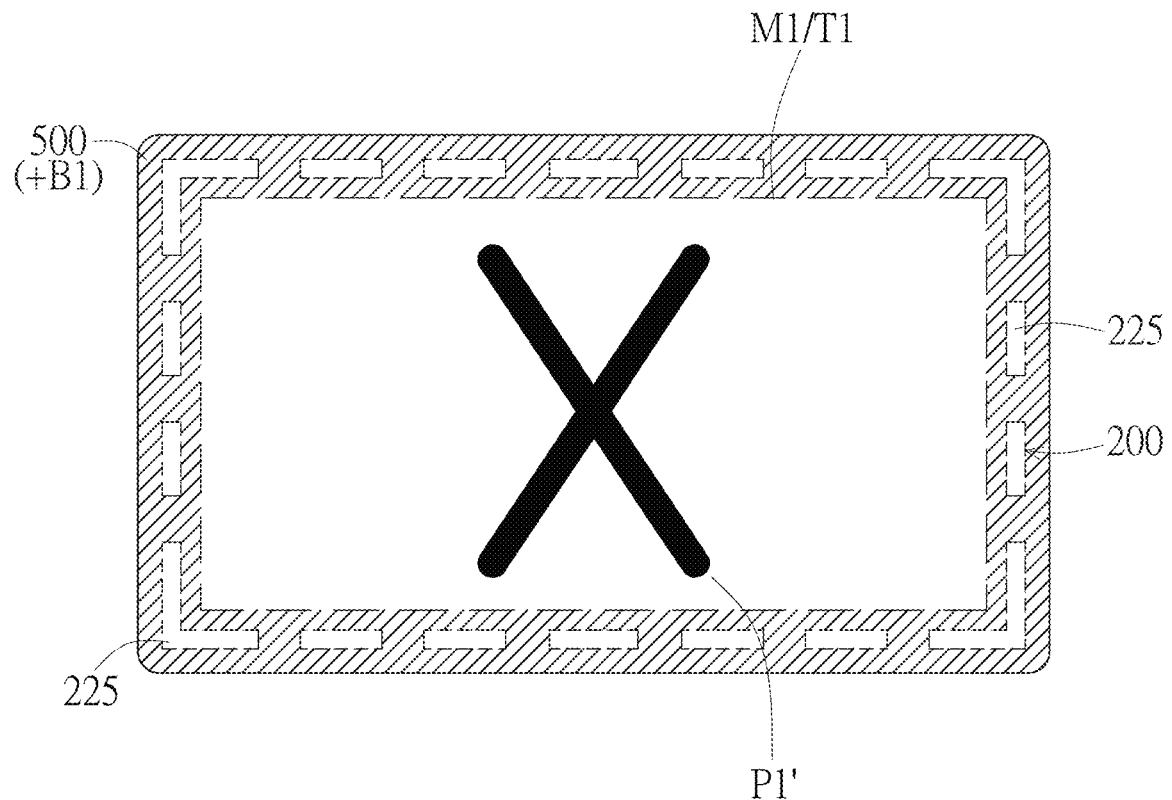
FIG. 11 is a schematic top view of the non-contact key having the touch module being the capacitive touch module according to an embodiment of the present invention.

Based on the above, according to the implementations shown in FIG. 9 and FIG. 10, observed in the top view direction D1, the configuration of the floating display area M1 and/or the floating touch area T1 where the default floating image P1' can be presented relative to the capacitive touch circuits 225 may be shown, for example, in FIG. 11. However, the above arrangement positions and manners of the capacitive touch circuits 225 are merely examples, and the present invention is not limited thereto. In addition, details not described in this implementation may be the same as or similar to, for example, the foregoing embodiments, or may be freely changed without causing a conflict with the core technical principle. The details are not described herein again.

Figure 12:
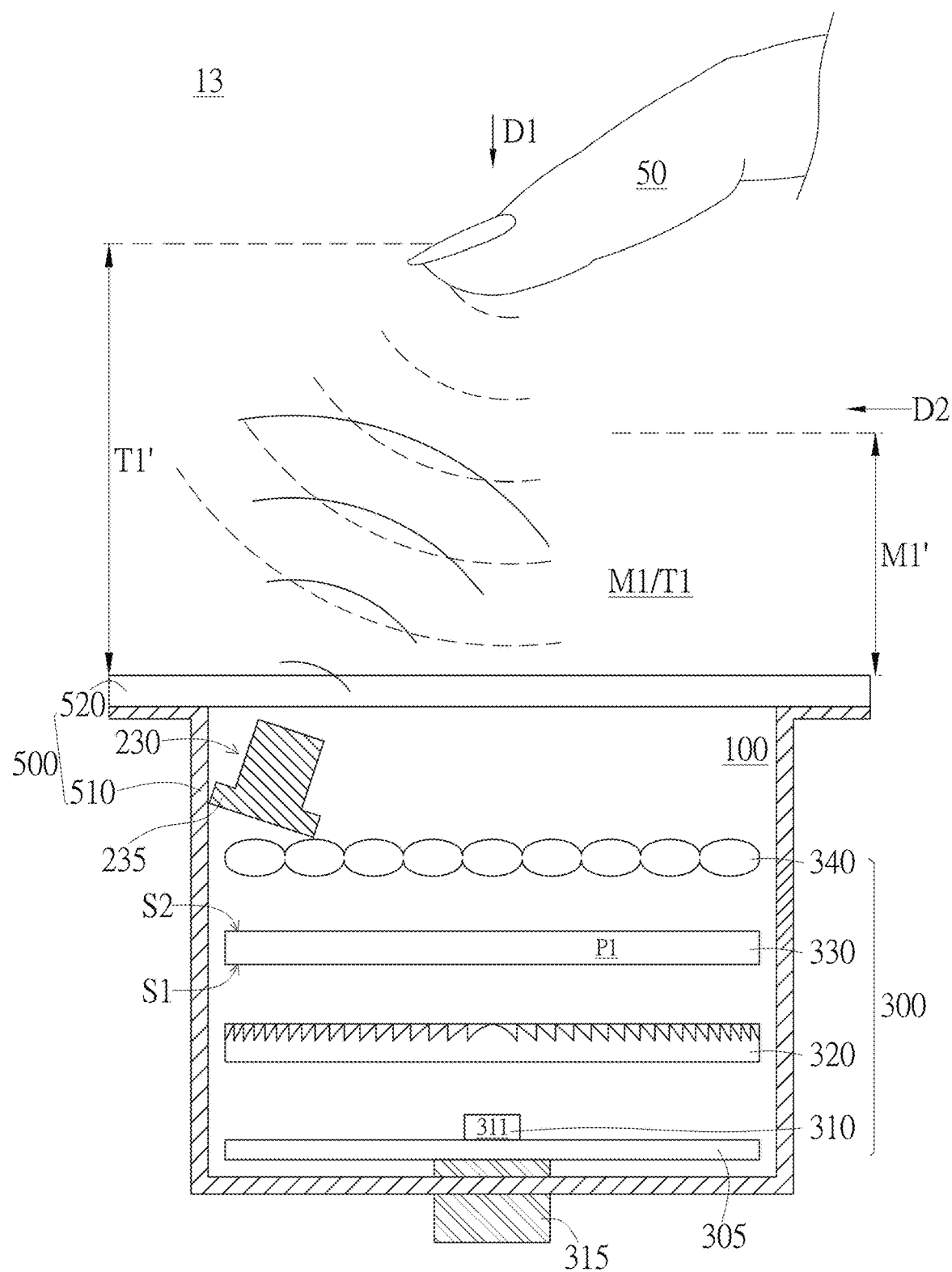
FIG. 12 is a schematic diagram of a non-contact key having a touch module being an ultrasonic touch module according to an embodiment of the present invention.

Next, according to yet another embodiment of the present invention, similar to the non-contact key 10 shown in FIG. 2, FIG. 12 shows a non-contact key 13 having a touch module 200 being an ultrasonic touch module 230. Specifically, the ultrasonic touch module 230 may include an ultrasonic transceiver 235. The ultrasonic transceiver 235 may be disposed between the floating display area M1 and the display module 300. Therefore, the floating touch area T1 that can be touched and sensed may be established above the center of the accommodating cavity 100 based on the ultrasonic transceiver 235.

According to some embodiments, as shown in FIG. 12, the ultrasonic transceiver 235 may be directly disposed in the accommodating cavity 100. For example, the ultrasonic transceiver 235 may be disposed above the display module 300, and is obliquely arranged at an angle to emit an ultrasonic wave toward the predetermined floating touch area T1 and/or receive an ultrasonic wave. Therefore, protruding apparatuses or assemblies along two sides of the accommodating cavity 100 can be reduced or omitted, thereby reducing required arrangement space on the two sides of the accommodating cavity 100.

Figure 13:
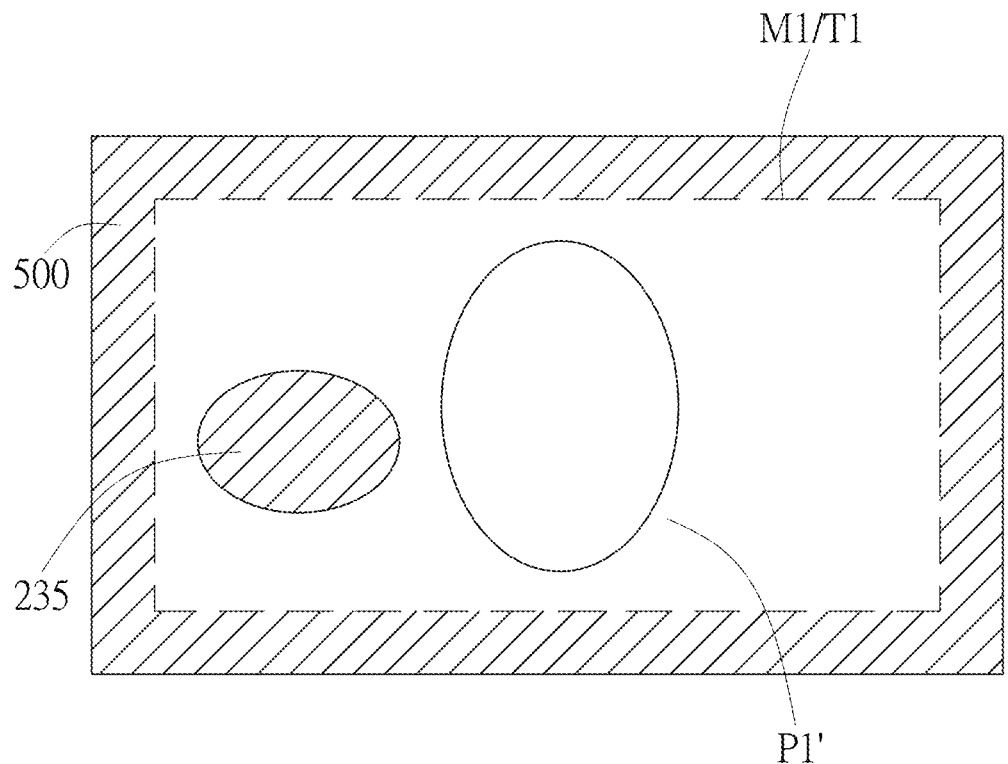
FIG. 13 is a schematic top view of the non-contact key having the touch module being the ultrasonic touch module according to an embodiment of the present invention.

Based on the above, according to the implementation shown in FIG. 12, observed in the top view direction D1, the configuration of the floating display area M1 and/or the floating touch area T1 where the default floating image P1' can be presented relative to the ultrasonic transceiver 235 may be shown, for example, in FIG. 13.

Figure 14:
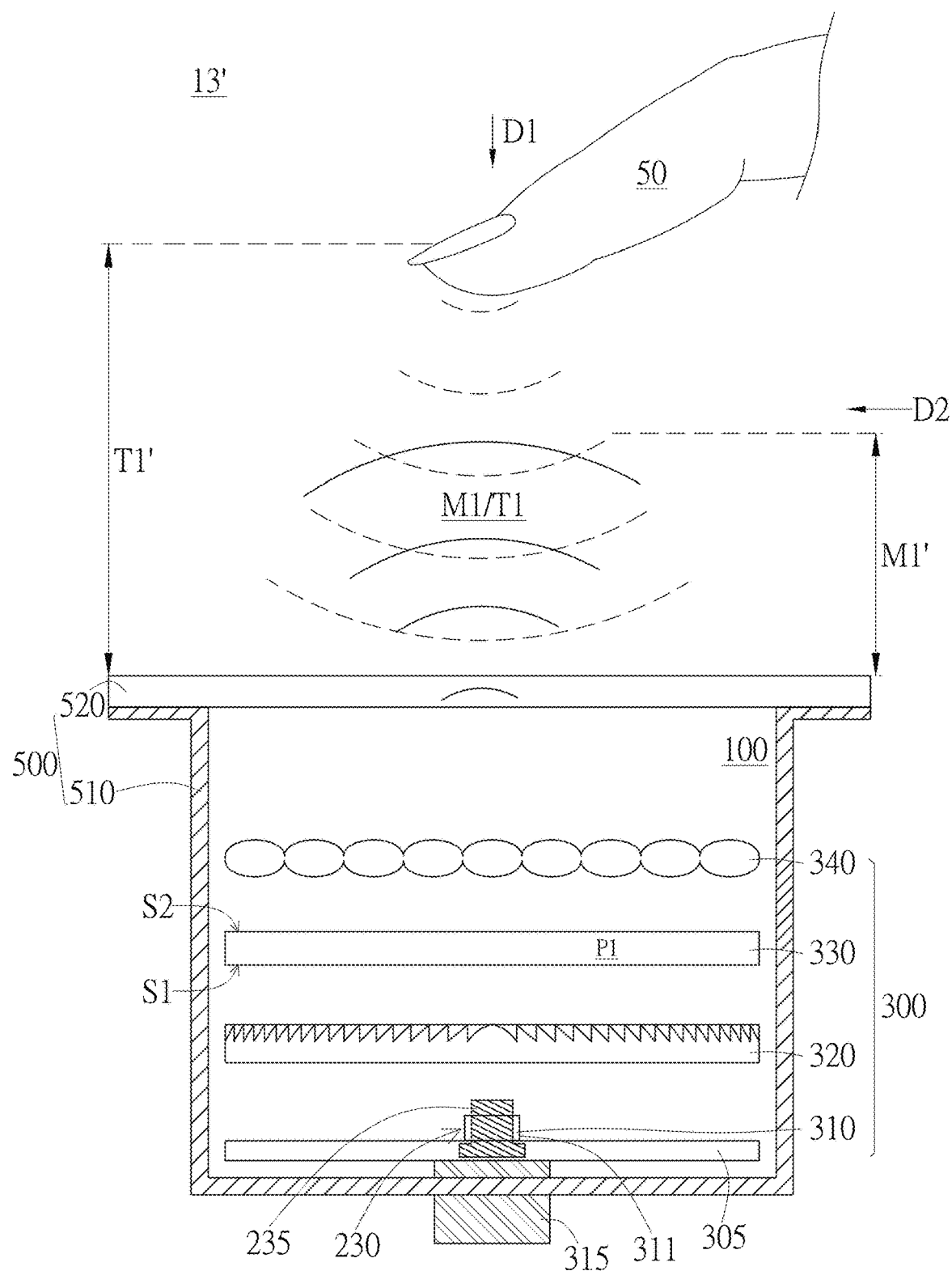
FIG. 14 is a schematic diagram of a non-contact key having a touch module being an ultrasonic touch module according to an embodiment of the present invention.
Figure 15:
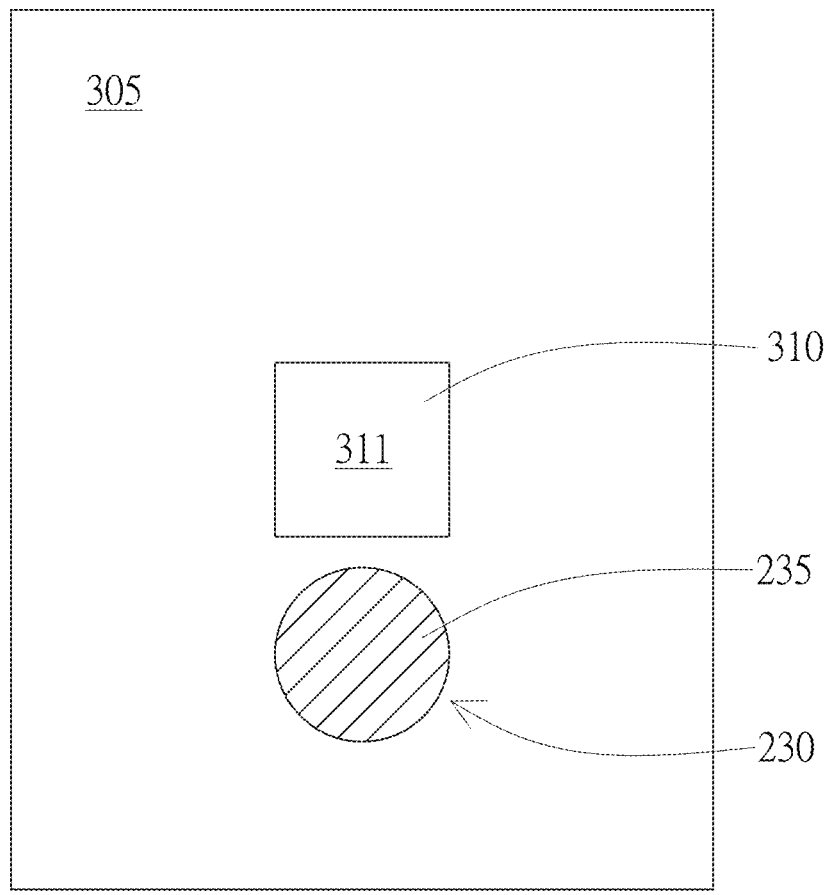
FIG. 15 is a schematic top view in which an ultrasonic transceiver and a first light source of a non-contact key are integrated on a same circuit board according to an embodiment of the present invention.

In addition, according to some embodiments, FIG. 14 shows a non-contact key 13' having a touch module 200 being an ultrasonic touch module 230. The ultrasonic transceiver 235 disposed in the accommodating cavity 100 may alternatively be directly disposed on a side of the optical unit 320 facing away from the imaging unit 330. For example, FIG. 15 is a schematic diagram showing relative configurations of the ultrasonic transceiver 235, the first light source 311, and a circuit board 305 of the non-contact key 13' of FIG. 14 observed in the top view direction D1. The ultrasonic transceiver 235 and the first light source 311 may be integratedly disposed on the same circuit board 305, so that the received and transmitted ultrasonic waves can pass through a stacked structure for floating touch and sensing. Therefore, the arrangement and the volume of the entire structure can be further simplified or reduced.

It is to be noted that, the above arrangement positions and manners of the ultrasonic transceiver 235 are merely examples, and the present invention is not limited thereto. In addition, details not described in this implementation may be the same as or similar to, for example, the foregoing embodiments, or may be freely changed without causing a conflict with the core technical principle. The details are not described herein again.

Figure 16:
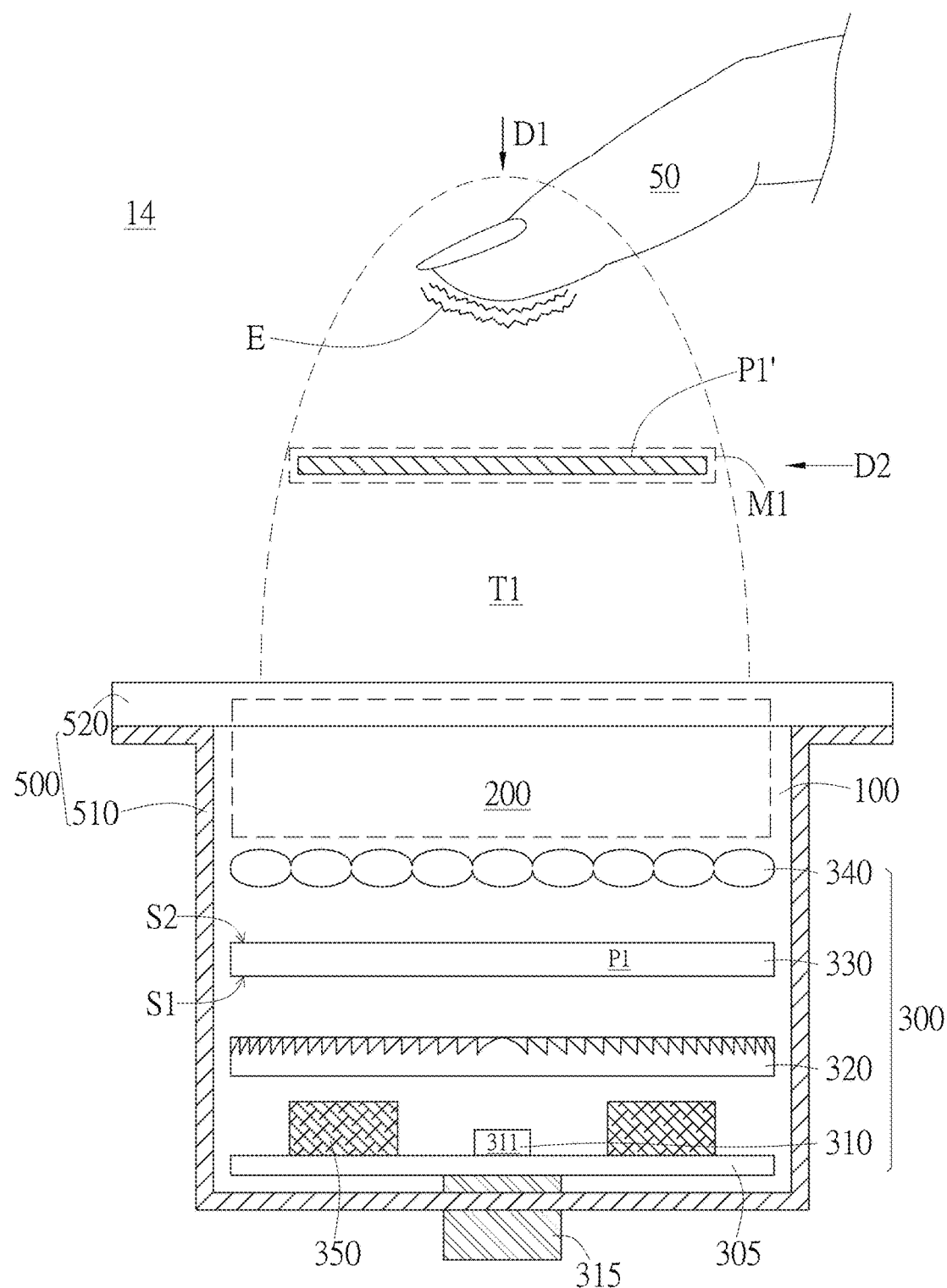
FIG. 16 is a schematic diagram of a non-contact key on which a tactile feedback module is further integrated according to an embodiment of the present invention.

Next, FIG. 16, in a non-contact key 14 according to some embodiments, a floating display module 300 and a floating touch module 200 may be arranged by using the various embodiments described above. Further, the non-contact key 14 may further include a tactile feedback module 350. The tactile feedback module 350 may be configured to generate a tactile feedback effect E when the floating touch area T1 is touched. For example, the tactile feedback module 350 may be integrated with the floating display module 300 and the floating touch module 200 based on any conventional or future developed manner such as gas jetting, gas vortex, ultrasonic sound acoustic radiation force, or focused ultrasonic manner. In this way, the tactile feedback effect E is generated when the floating touch area T1 is touched. Based on the above, an operator may further acquire tactile feedback from actual sense organs during touch based on the tactile feedback effect E. In this way, the level of user experience can be improved, and the operation reliability can be enhanced.

Similar to that of the foregoing floating touch module 200, a range of the tactile feedback effect E generated by the tactile feedback module 350 and the floating display area M1 and the floating touch area T1 may be arranged relative to a central axis same.

As shown in FIG. 16, similarly, the tactile feedback module 350 for generating the tactile feedback effect E and the first light source 311 may be integrated on the circuit board 305. In this way, different modules are simplified and integrated, so that the space occupied by the entire non-contact key 14 can be further reduced.

Based on the above, according to some embodiments, when the floating touch module 200 is the ultrasonic touch module 230, the ultrasonic touch module 230 may be configured to further generate the tactile feedback effect E when the floating touch area T1 is touched. Therefore, the tactile feedback effect E can be achieved without a need to further dispose the tactile feedback module 350.

Further, according to some embodiments of the present invention, since electronic configuration supports an external shape and an electrical signal of a conventional switch module, the conventional switch module can be easily transformed into the display device 1 or the various non-contact keys (for example, the non-contact keys 11, 12, 12', 13, 13', and 14) described above.

In addition, since the display device 1 or the non-contact keys (for example, the non-contact keys 11, 12, 12', 13, 13', and 14) described above can perform imaging without using complex and bulky apparatuses such as a liquid crystal display panel and an organic LED display panel, and the floating display area M1 and the floating touch area T1 are prevented from diffusing into other adjacent non-contact keys (for example, the non-contact keys 11, 12, 12', 13, 13', and 14) during configuration of the floating display and the floating touch, a key array in an adjacent arrangement can be easily integrated to be used as a more complex and precise input device.

Figure 17:
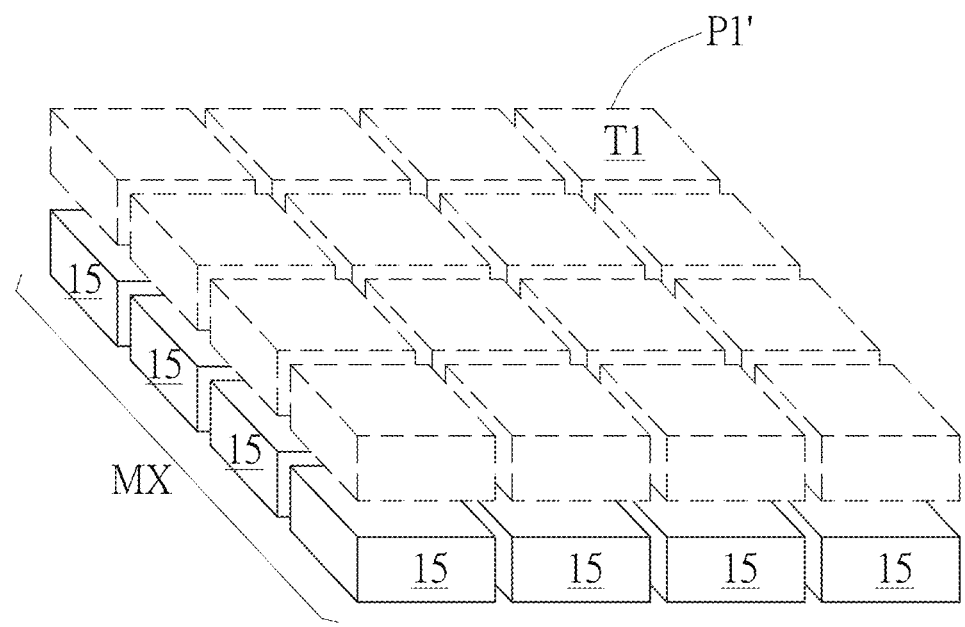
FIG. 17 is a schematic diagram of an input device having a plurality of non-contact keys according to an embodiment of the present invention.

For example, referring to FIG. 17, an embodiment of the present invention provides an input device 1000. The input device 1000 may have a key array MX including a plurality of non-contact keys 15 in an adjacent arrangement. Based on the above, an architecture of each non-contact key 15 may be the same as or similar to the architecture of the non-contact key 11, 12, 12', 13, 13', or 14. Therefore, the input device 1000 may establish respective default floating images P1' and floating touch areas T1 without mutual interference between adjacent non-contact keys 15. In this way, the operator can identify and perform an action (for example, touching or pressing) for inputting without contacting an entity object. Therefore, sanitation problems and the risk of cross-contamination of pathogens can be reduced or avoided, and wear can be reduced to prolong the service life of the input device 1000. Further, since each non-contact key 15 is arranged independently with a simple architecture, in a case that any of the non-contact keys 15 is damaged, the non-contact key 15 can be easily repaired or replaced, thereby reducing the maintenance cost and difficulty.

As described above, the non-contact keys 15 and the input device 1000 are applicable to various input systems for input purposes, especially input occasions or systems requiring arrangement of a plurality of keys and having a high precision requirement. For example, the non-contact keys 15 and the input device 1000 are applicable to public use such as elevator operation panels, ATM machines, automatic door buttons, ticket-issuing machines, and ticket-taking machine to be used by an indefinite number of people.

To sum up, by means of the display device, the non-contact key, and the input device in the embodiments of the present invention, the default floating image can be formed at a floating position for identification. Further, floating touch and corresponding non-contact operations may be further implemented by using a touch generation apparatus or other apparatuses. Based on the above, the display device, the non-contact key, and the input device in the embodiments of the present invention can be more easily integrated to and are more applicable to various conventional display units and key units by virtue of the simplified imaging architecture, thereby improving the feasibility, the universality, and the reliability of floating display, floating touch, and floating input.

The above are merely some exemplary embodiments of the present invention. It should be noted that various variations and amendments may be made to the present invention without departing from the spirit and the principle of the present invention. A person of ordinary skill in the art should understand that the present invention is defined by the claims attached, and in a case of complying with the intention of the present invention, various possible changes such as substitutions, combinations, modifications and diversions fall within the scope of the present invention as defined in the claims attached.

REFERENCE NUMERALS

1: display device
10, 11, 12, 12', 13, 13', 14, 15: non-contact key
50: touch and sensing object
100: accommodating cavity
200: touch module
210: infrared touch module
212: infrared generator
214: infrared receiver
220: capacitive touch module
225: capacitive touch circuits
230: ultrasonic touch module
235: ultrasonic transceiver
300: display module
305: circuit board
310: light source
311: first light source
312: second light source 315: connection unit
320: optical unit
330: imaging unit
340: lens array
345: lens unit
350: tactile feedback module
500: frame
510: wall body
520: transparent cover plate
600: floating three-dimensional key
1000: input device
B1: shielding pattern
D1: top view direction
D2: side view direction
L1: light
L2: light
P1: preset pattern
P1': default floating image
P1": feedback floating image
M1: floating display area
M1': floating display area range
T1: floating touch area
T1': floating touch area range
E: tactile feedback effect
d1: arrangement direction
S1: surface
S2: surface
R1, R2: infrared ray
g: size
OP: opening
C: outline
C1: tangent line
N: normal line
θ: included angle
MX: key array

What is claimed is:

1. A non-contact key, comprising:
a frame, including an accommodating cavity;
a touch module; and
a display module, disposed in the accommodating cavity and comprising:
   a first light source, emitting light;
   an optical unit;
   an imaging unit, arranged on a side of the optical unit facing away from the first light source and having a preset pattern, wherein the preset pattern is a constant static image designed according to a default floating image; and
   a lens array, arranged on a side of the imaging unit facing away from the first light source,
wherein corresponding to the preset pattern, the light emitted by the first light source passes through the optical unit, the imaging unit, and the lens array to form the default floating image in a floating display area outside the accommodating cavity,
wherein the touch module is configured to establish a floating touch area outside the accommodating cavity, such that the floating display area at least partially overlaps the floating touch area,
wherein the touch module is an ultrasonic touch module disposed adjacent to the first light source, and
wherein the non-contact key is arranged as one of a plurality of non-contact keys having similar architecture and disposed adjacent to each other in an array such that there is no interference between the respective floating touch areas of adjacent non-contact keys.

2. The non-contact key of claim 1, wherein the first light source is a light emitting diode (LED).

3. The non-contact key of claim 1, wherein the display module further comprises a second light source configured to emit light having color different from that of the light emitted by the first light source, and the second light source is disposed on a side of the optical unit facing away from the imaging unit; and
during displaying of the default floating image based on the light emitted by the first light source, if the floating touch area is touched, the display module turns off the first light source and causes the second light source to emit the light, so as to form, outside the accommodating cavity, a feedback floating image corresponding to the preset pattern and having a color different from that of the default floating image.

4. The non-contact key of claim 1, wherein the first light source is a light source capable of adjusting the color of the emitted light; and
during displaying of the default floating image based on the light emitted by the first light source, if the floating touch area is touched, the display module switches the color of the light emitted by the first light source, so as to form, outside the accommodating cavity, a feedback floating image corresponding to the preset pattern and having a color different from that of the default floating image.

5. The non-contact key of claim 1, wherein the optical unit is a Fresnel lens.

6. The non-contact key of claim 1, wherein the imaging unit is a negative film, a photomask, or a layer diaphragm.

7. The non-contact key of claim 1, wherein the lens array is a single-sided convex lens array or a double-sided convex lens array.

8. The non-contact key of claim 1, wherein the lens array comprises a plurality of lens units arranged substantially parallel to an arrangement direction of a surface of the imaging unit facing the lens array, and a size of each of the lens units in the arrangement direction is in a range of 0.2-1 mm.

9. The non-contact key of claim 1, wherein the touch module is an ultrasonic touch module and comprises:
an ultrasonic transceiver, arranged between the floating display area and the display module.

10. The non-contact key of claim 9, wherein the ultrasonic transceiver is arranged in the accommodating cavity.

11. The non-contact key of claim 1, wherein the touch module is an ultrasonic touch module and comprises:
an ultrasonic transceiver, arranged on a side of the optical unit facing away from the imaging unit.

12. The non-contact key of claim 1, further comprising a tactile feedback module, wherein the tactile feedback module is configured to generate a tactile feedback effect when the floating touch area is touched.

13. The non-contact key of claim 1, wherein the touch module is an ultrasonic touch module, and the ultrasonic touch module is configured to further generate a tactile feedback effect when the floating touch area is touched.

14. The non-contact key of claim 1, wherein a cross-sectional area of the default floating image, the floating touch area, or a combination of the default floating image and the floating touch area substantially parallel to a surface of the imaging unit facing the lens array gradually decreases in a direction facing away from the display module.

15. The non-contact key of claim 1, wherein an included angle between a tangent line of an outline of the default floating image, the floating touch area, or a combination of the default floating image and the floating touch area and a normal line substantially perpendicular to a surface of the imaging unit facing the lens array is in a range of 85 to 45 degrees.

16. The non-contact key of claim 1, wherein in a top view from a side of the lens array facing away from the imaging unit, an area of the imaging unit is equal to or greater than an area of the default floating image.

17. The non-contact key of claim 1, wherein the default floating image is a naked-eye three-dimensional image.

18. The non-contact key of claim 17, wherein the naked-eye three-dimensional image is an image presenting a floating three-dimensional key.

19. An input device, having a key array comprising a plurality of non-contact keys according to claim 1 in an adjacent arrangement.

* * * * *